(12) United States Patent (10) Patent No.: US 8,917,541 B2
Ohno et al. (45) Date of Patent: Dec. 23, 2014

(54) MAGNETORESISTANCE EFFECT ELEMENT AND MAGNETIC MEMORY

(75) Inventors: Hideo Ohno, Sendai (JP); Shoji Ikeda, Sendai (JP); Fumihiro Matsukura, Sendai (JP); Masaki Endoh, Sendai (JP); Shun Kanai, Sendai (JP); Hiroyuki Yamamoto, Shiki (JP); Katsuya Miura, Higashimurayama (JP)

(73) Assignees: Hitachi, Ltd., Tokyo (JP); Tohoku University, Miyagi (JP)

( * ) Notice: Subject to any disclaimer, the term of this patent is extended or adjusted under 35 U.S.C. 154(b) by 79 days.

(21) Appl. No.: 13/701,846

(22) PCT Filed: May 31, 2011

(86) PCT No.: PCT/JP2011/062493
§ 371 (c)(1),
(2), (4) Date: Dec. 28, 2012

(87) PCT Pub. No.: WO2011/152400
PCT Pub. Date: Dec. 8, 2011

(65) Prior Publication Data
US 2013/0094284 A1   Apr. 18, 2013

(30) Foreign Application Priority Data

Jun. 4, 2010 (JP) .................................. 2010-129086

(51) Int. Cl.
*G11C 11/00* (2006.01)
*G11C 11/16* (2006.01)
*H01L 43/08* (2006.01)
*H01L 43/12* (2006.01)
*H01L 43/02* (2006.01)
*G11B 5/31* (2006.01)
*H01L 27/22* (2006.01)

(52) U.S. Cl.
CPC ................. *G11B 5/31* (2013.01); *H01L 27/228* (2013.01); *G11C 11/1675* (2013.01); *G11C 11/16* (2013.01); *H01L 43/08* (2013.01); *H01L 43/12* (2013.01); *H01L 43/02* (2013.01)
USPC .......................................... 365/158; 365/173

(58) Field of Classification Search
CPC .. G11C 11/16; G11C 11/161; G11C 11/1675; G11C 11/02; G11B 5/31; H01L 27/228; H01L 43/02; H01L 43/08; H01L 43/12; H01L 45/145
USPC .............. 365/158, 66, 97, 148, 163, 171, 173
See application file for complete search history.

(56) References Cited

U.S. PATENT DOCUMENTS 8,072,800 B2 * 12/2011 Chen et al. .................... 365/158
8,120,127 B2 *  2/2012 Nagahara et al. ............. 257/421

(Continued)

FOREIGN PATENT DOCUMENTS

JP   2007-142364   6/2007
JP   2007-266498   10/2007

(Continued)

OTHER PUBLICATIONS
U.S. Appl. No. 13/578,866, filed Aug. 14, 2012, Ohno.

(Continued)

*Primary Examiner* — Tan T. Nguyen
(74) *Attorney, Agent, or Firm* — Antonelli, Terry, Stout & Kraus, LLP.

(57) ABSTRACT

Provided are a magneto resistive effect element with a stable magnetization direction perpendicular to a film plane and with a controlled magnetoresistance ratio, and a magnetic memory using the magneto resistive effect element. Ferromagnetic layers 106 and 107 of the magneto resistive effect element are formed from a ferromagnetic material containing at least one type of 3$d$ transition metal such that the magnetoresistance ratio is controlled, and the film thickness of the ferromagnetic layers is controlled on an atomic layer level such that the magnetization direction is changed from a direction in the film plane to a direction perpendicular to the film plane.

34 Claims, 6 Drawing Sheets

(56) References Cited

U.S. PATENT DOCUMENTS

| | | | |
|---|---|---|---|
| 8,154,913 B2* | 4/2012 | Fukami et al. | 365/158 |
| 8,593,862 B2* | 11/2013 | Ranjan et al. | 365/158 |
| 8,625,342 B2* | 1/2014 | Higo et al. | 365/171 |
| 2007/0086121 A1 | 4/2007 | Nagase et al. | |
| 2007/0228501 A1 | 10/2007 | Nakamura | |
| 2008/0089118 A1 | 4/2008 | Kajiyama | |
| 2009/0080239 A1 | 3/2009 | Nagase et al. | |

FOREIGN PATENT DOCUMENTS

| | | |
|---|---|---|
| JP | 2008-98515 | 4/2008 |
| JP | 2009-81315 | 4/2009 |

OTHER PUBLICATIONS

S. Mangin et al., Current-induced magnetization reversal in nanopillars with perpendicular anisotropy, Nature Materials, Mar. 2006, pp. 210-215, vol. 5. www.nature.com/naturematerials.

M. Endo et al., Electric-field effects on thickness dependent magnetic anisotropy of sputtered $MgO/Co_{40}Fe_{40}B_{20}/Ta$ structures, Applied Physics Letters 96, 212503 (2010).

Office Action issued in Japanese Patent Application No. 2010-129086 on Oct. 28, 2014.

* cited by examiner

MAGNETORESISTANCE EFFECT ELEMENT AND MAGNETIC MEMORY

TECHNICAL FIELD

The present invention relates to a magneto resistive effect element, and a magnetic memory provided with the magneto resistive effect element as a memory cell.

BACKGROUND

As shown in FIG. 1, a memory cell 100 of a magnetic random access memory (MRAM) has a structure such that a magneto resistive effect element 101 and a select transistor 102 are electrically connected in series. Source, drain, and gate electrodes of the select transistor 102 are electrically connected to a source line 103, a bit line 104 via the magneto resistive effect element 101, and a word line 105, respectively. The magneto resistive effect element 101 has a three-layer structure as a basic structure in which a non-magnetic layer 108 is sandwiched between two ferromagnetic layers, i.e., a first ferromagnetic layer 106 and a second ferromagnetic layer 107. In the illustrated example, the first ferromagnetic layer 106 has a fixed magnetization direction and provides a pinned layer. The second ferromagnetic layer 107 has a variable magnetization direction and provides a recording layer. The magneto resistive effect element 101 has a low resistance when the magnetization direction of the first ferromagnetic layer 106 and the magnetization direction of the second ferromagnetic layer 107 are parallel to each other (P state), or a high resistance when the directions are anti-parallel to each other (AP state). In the MRAM, the changes in resistance are associated with bit information of "0" and "1". The bit information is written by spin-torque-induced magnetization reversal due to a current that flows through the magneto resistive effect element 101. When the current flows from the pinned layer to the recording layer, the magnetization of the recording layer is anti-parallel to the magnetization of the pinned layer, and the bit information is "1". When the current flows from the recording layer to the pinned layer, the magnetization of the recording layer is parallel to the magnetization of the pinned layer, and the bit information is "0". Because the speed of magnetization reversal by the current is on the order of one nanosecond, the MRAM is capable of writing at very high speed. Further, because the recording of bit information is based on the direction of magnetization of the recording layer, the MRAM is non-volatile and can reduce power consumption during standby. Thus, the MRAM is gaining attention as a next-generation memory.

While FIG. 1 shows the case in which, in the magneto resistive effect element 101, the first ferromagnetic layer 106 is the pinned layer and the second ferromagnetic layer 107 is the recording layer, a similar MRAM operation can be performed when the first ferromagnetic layer 106 is configured as the recording layer with a variable magnetization direction and the second ferromagnetic layer 107 is configured as the pinned layer with a fixed magnetization direction. In this case, too, the magnetization of the recording layer is anti-parallel to the magnetization of the pinned layer when a current flows from the pinned layer to the recording layer, such that the bit information is "1". When the current flows from the recording layer to the pinned layer, the magnetization of the recording layer is parallel to the magnetization of the pinned layer, and the bit information is "0".

RELATED ART DOCUMENT

Non-patent Document 1: S. MANGIN, D. RAVELOSONA, J. A. KATINE, M. J. CAREY, B. D. TERRIS and ERIC E. FULLERTON, "Current-induced magnetization reversal in nanopillars with perpendicular anisotropy", Nature Mater., 5, 210 (2006)

DISCLOSURE OF THE INVENTION

Problems to be Solved by the Invention

In order to realize a MRAM, several problems need to be overcome. For example, three characteristics of the magneto resistive effect element as a recording element, namely the magnetoresistance ratio (MR ratio), write current density, and thermal stability factor, need to be satisfied. These conditions may vary depending on the integration level, minimum process dimensions, operating speed, and the like of the MRAM. For example, as the read speed is increased, higher magnetoresistance ratio values are required; generally, a high magnetoresistance ratio of 70% to 100% is required. Further, the write current density needs to be not more than $2\times10^6$ A/cm$^2$ so as to achieve an increase in write speed and a decrease in power consumption. For ensuring a record retention time of 10 years or more and preventing erroneous writing, the thermal stability factor of 80 or higher is required.

In a known configuration, in order to achieve a high magnetoresistance ratio, a material including a 3d transition metal element is used for the first ferromagnetic layer and the second ferromagnetic layer, while MgO is used for the non-magnetic layer. In this case, the material including the 3d transition metal element may preferably have a bcc structure. This is because of the advantage that, when the material including the 3d transition metal element has the bcc structure, coherent conduction with MgO is realized, whereby the magnetoresistance ratio can be readily increased. In this case, the magnetization directions of the first ferromagnetic layer and the second ferromagnetic layer are parallel to the film plane, as shown in FIG. 1. On the other hand, it has been suggested that when a multilayer film of Co and Pt, Ni and Pt, and the like, or a perpendicular magnetic anisotropy material represented by alloys such as FePt and TbFeCo, is used in the first ferromagnetic layer and the second ferromagnetic layer, as described in Non-patent Document 1, low write current density and high thermal stability factor can be realized. This is due to the magnetization directions of the first ferromagnetic layer and the second ferromagnetic layer becoming perpendicular to the film plane. However, in the case of the combination of these perpendicular magnetic anisotropy materials and MgO, the magnetoresistance ratio becomes small. Thus, various methods have been tried to increase the MR ratio. For example, a material of the bcc structure with magnetization parallel to the film plane and containing a 3d transition metal element is inserted between MgO and the perpendicular magnetic anisotropy material. However, in this method, the structure is complicated and problems remain, such the control of the magnetization direction of the material including the 3d transition metal element and the less than expected increase in magnetoresistance ratio.

Means for Solving the Problems

According to the present invention, the material used for at least one of a first ferromagnetic layer and a second ferromagnetic layer of a magneto resistive effect element is a material such as CoFe and CoFeB containing at least one type of 3d transition metal such as Co or Fe, or a Heusler alloy represented by $Co_2MnSi$, $Co_2FeAl$, $Co_2CrAl$, and the like so that the magnetoresistance ratio can be controlled. Use of these materials enables realization of coherent tunneling conduction of electrons by a MgO barrier layer and the Δ1 band, whereby a high MR ratio can be realized. Because Heusler alloys are a half metal material and have high spin polarizability (approximately 100%), they are effective in realizing an even higher MR ratio than possible with conventional ferromagnets, such as CoFe. Heusler alloys have a small damping factor α and are an effective material for decreasing the write current density $J_{c0}$. Normally, when a magneto resistive effect element is formed from materials such as CoFe or CoFeB, the magnetization direction of the ferromagnetic layers is oriented in a direction parallel to the film plane. However, the present inventors have developed a technology for realizing a low write current density and a high thermal stability factor by making the magnetization direction perpendicular to the film plane by controlling the film thickness of the ferromagnetic layers on an atomic layer level.

FIG. 2 shows the film thickness necessary for making the magnetization direction perpendicular to the film plane versus the temperature in an annealing step of the manufacturing process, in an example in which CoFeB is used for the ferromagnetic layers. In the example, annealing was conducted for an hour. The white dots in FIG. 2 indicate upper limits of the film thickness, while the black dots indicate lower limits. As shown, the range of film thickness of CoFeB in which the magnetization direction becomes perpendicular to the film plane varies in accordance with the annealing temperature.

The example of FIG. 2 is for CoFeB, and the relationship between the film thickness necessary for the magnetization direction to be perpendicular to the film plane and the annealing temperature may differ from FIG. 2 when the material contains at least one type of other 3d transition metal, such as CoFe or Fe. However, the magnetization direction can be changed from being parallel to perpendicular with respect to the film plane by suitably controlling the film thickness for the material. The cause of the magnetization direction becoming perpendicular to the film plane is believed to involve a specific change in anisotropy at the interface of CoFeB and the like. By forming a thin film by controlling the film thickness of CoFeB on an atomic layer level, the ratio of volume in which the interfacial effect is present relative to the volume of the CoFeB layer can be increased. Thus, the effect of specific anisotropy at the interface becomes pronounced such that the magnetization direction becomes perpendicular to the film plane. The effect is particularly increased at the interface between an oxygen-containing compound represented by MgO, $Al_2O_3$, $SiO_2$, and the like, and a ferromagnetic material containing at least one type of 3d transition metal, such as Co and Fe, whereby the magnetization tends to be more easily oriented in the direction perpendicular to the film plane.

FIG. 3 shows the magnetoresistance ratio of the magneto resistive effect element in an example in which CoFeB is used for the first ferromagnetic layer and the second ferromagnetic layer, versus the annealing temperature, with MgO used for the non-magnetic layer. As the annealing temperature is increased, the magnetoresistance ratio increases. Thus, in this example, annealing may be performed at approximately 250° C. to obtain a magnetoresistance ratio of 70%, or at 300° C. to obtain a magnetoresistance ratio of 100%. In this case, in order to obtain a magneto resistive effect element with the magnetization direction perpendicular to the film plane when the annealing temperature is 300° C., the film thickness of the first ferromagnetic layer and the second ferromagnetic layer may be controlled to be on the order of 1.0 nm to 1.6 nm, according to FIG. 2. In this way, the magneto resistive effect element of the present invention can achieve a magnetoresistance ratio of 70% or more which is necessary for high-speed reading.

Even when other material is used, it is possible to make the magneto resistive effect element with a desired magnetoresistance ratio and the magnetization direction oriented in a perpendicular direction to the film plane by investigating the relationship between the annealing temperature and the magnetoresistance ratio in advance. FIG. 4 shows the resistance change of the magneto resistive effect element versus a magnetic field applied in a perpendicular direction with respect to the film plane in an example in which CoFeB is used as the material of the first ferromagnetic layer and the second ferromagnetic layer and MgO is used for the non-magnetic layer. In this example, the annealing temperature was 300° C. The experimental result shows that the magnetization directions of the recording layer and the pinned layer are oriented perpendicular to the film plane, and that the resistance of the element is changed in accordance with the magnetization reversal of the recording layer and the pinned layer due to change in applied magnetic field. The magnetoresistance ratio at this time was 100%.

EFFECTS OF THE INVENTION

By applying the present invention, a magneto resistive effect element with a large magnetoresistance ratio and a magnetization direction perpendicular to the film plane can be easily made. When it is desired to control the magnetoresistance ratio, the annealing temperature may be controlled and the film thickness of the first ferromagnetic layer and the second ferromagnetic layer, which are formed with a non-magnetic layer sandwiched therebetween, may be adjusted, whereby a magneto resistive effect element can be made in which a perpendicular magnetization direction with respect to the film plane is maintained.

MODE FOR CARRYING OUT THE INVENTION

In the following, a magnetic memory and a magneto resistive effect element to which the present invention is applied will be described in detail with reference to the drawings.
<First Embodiment>

Figure 5:
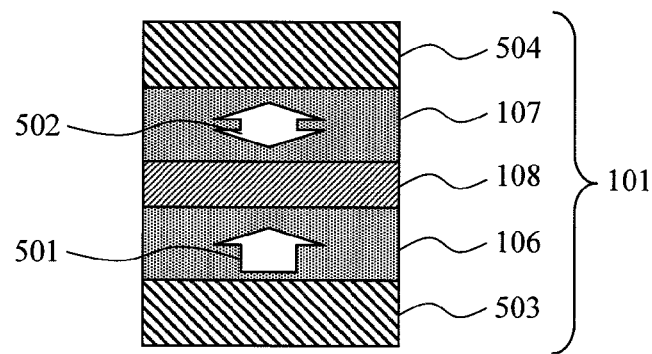
FIG. 5 is a schematic cross sectional view of an example of the magneto resistive effect element according to the present invention.

FIG. 5 schematically shows a structure of a magneto resistive effect element according to the first embodiment. The magneto resistive effect element 101 is provided with a first ferromagnetic layer 106 with a fixed magnetization direction; a second ferromagnetic layer 107 with a variable magnetization direction; and a non-magnetic layer 108 electrically connected between the first ferromagnetic layer and the second ferromagnetic layer. The material of the first ferromagnetic layer 106 and the second ferromagnetic layer 107 is $Co_{20}Fe_{60}B_{20}$, while the non-magnetic layer 108 is formed from MgO with a thickness of 1 nm. The first ferromagnetic layer 106 has a film thickness of 1.0 nm, and the second ferromagnetic layer has a film thickness of 1.2 nm For an underlayer 503 and a capping layer 504, Ta with a thickness of 5 nm is used. A layered thin film with the configuration of FIG. 5 is made by sputtering in ultrahigh vacuum, and is thereafter annealed at 300° C. for crystallization of the first ferromagnetic layer, the second ferromagnetic layer, and the non-magnetic layer.

Figure 1:
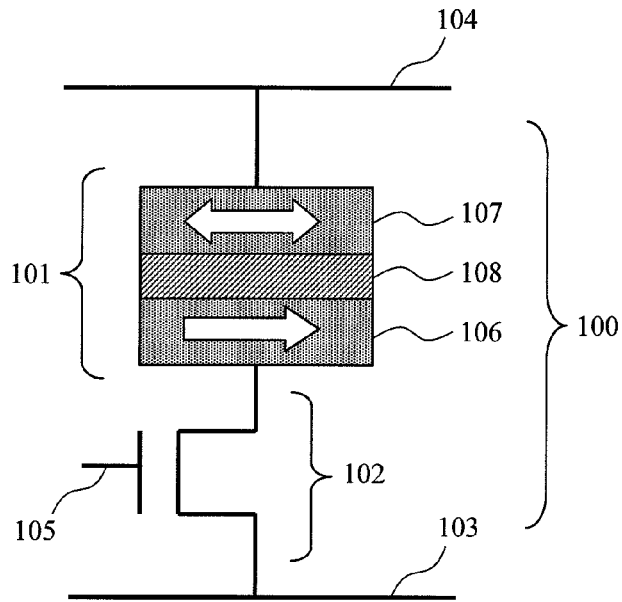
FIG. 1 is a schematic diagram of a basic structure of a memory cell of a magnetic memory.
Figure 2:
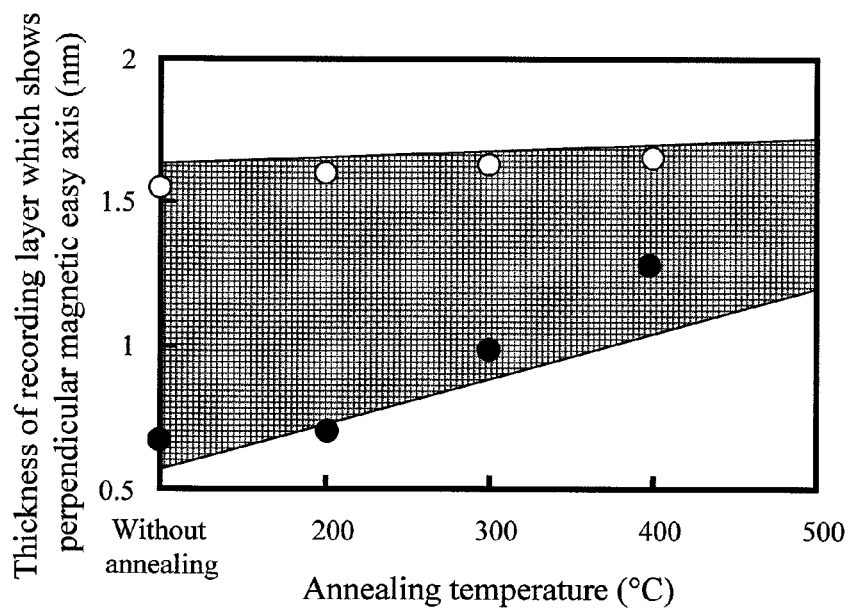
FIG. 2 shows changes in the film thickness necessary for the magnetization direction of a magneto resistive effect element to become perpendicular to the film plane, versus the temperature in an annealing step in a case where CoFeB is used for a first ferromagnetic layer and a second ferromagnetic layer.
Figure 3:
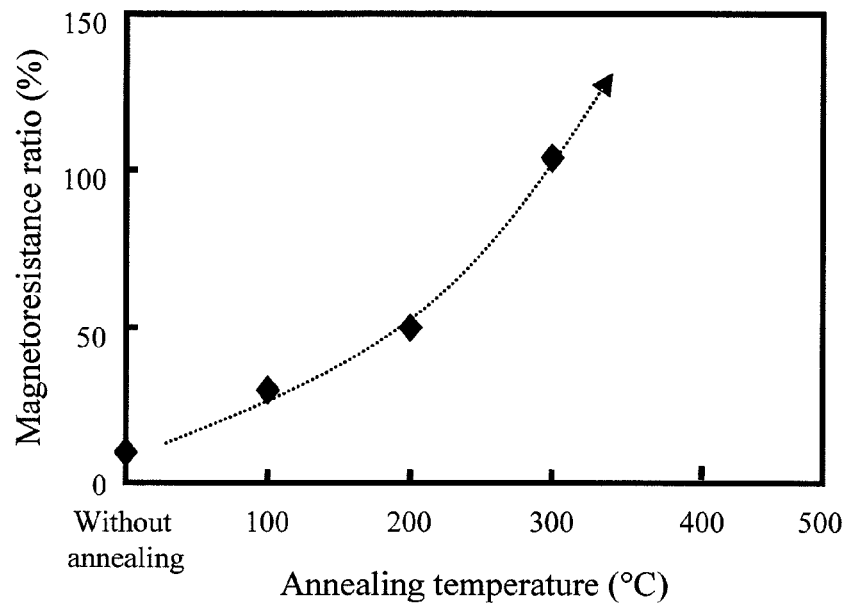
FIG. 3 shows a change in the magnetoresistance ratio of the magneto resistive effect element versus the temperature in the annealing step in the case where CoFeB is used for the first ferromagnetic layer and the second ferromagnetic layer.
Figure 4:
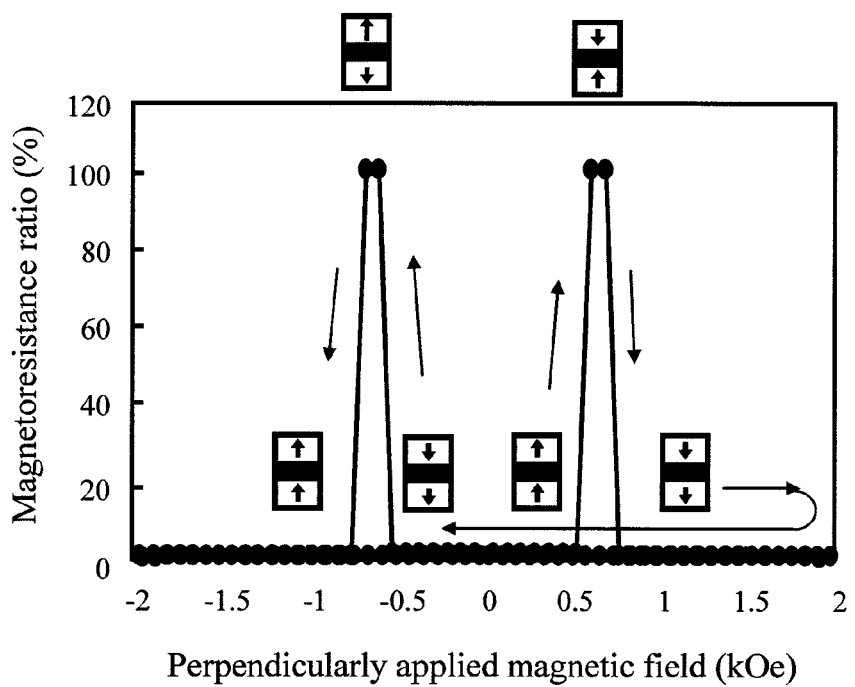
FIG. 4 shows a resistance change in the magneto resistive effect element versus magnetic field application in a perpendicular direction to the film plane in the case where CoFeB is used for the first ferromagnetic layer and the second ferromagnetic layer.

With reference to FIG. 2, the magnetic easy axis of the CoFeB layers of the first ferromagnetic layer 106 and the second ferromagnetic layer 107 can be made perpendicular to the film plane by controlling the film thickness of the layers to be on the order of 1.0 nm to 1.6 nm when the annealing temperature is 300° C. According to the present embodiment, the first ferromagnetic layer 106 has a film thickness of 1.0 nm and the second ferromagnetic layer 107 has a film thickness of 1.2 nm. By applying these film thicknesses, magnetization 501 of the first ferromagnetic layer and magnetization 502 of the second ferromagnetic layer are oriented in a perpendicular direction, as shown in FIG. 5. By providing the film thickness difference between the first ferromagnetic layer 106 and the second ferromagnetic layer 107, the ease of magnetization reversal of the pinned layer and the recording layer can be controlled.

The relationship between the film thickness of CoFeB and the ease of magnetization reversal of the recording layer and the pinned layer (i.e., the difference in current density $J_{c0}$ required for magnetization reversal) will be described in greater detail. The current density $J_{c0}$ required for magnetization reversal of the magnetic layers can be expressed by the following expression.

$$J_{c0} \propto \alpha \cdot K_{eff} t \quad (1)$$

where $\alpha$ is the Gilbert damping factor, t is the film thickness of the magnetic layers, and $K_{eff}$ is the perpendicular magnetic anisotropy energy density of the magnetic layers.

Figure 6A:
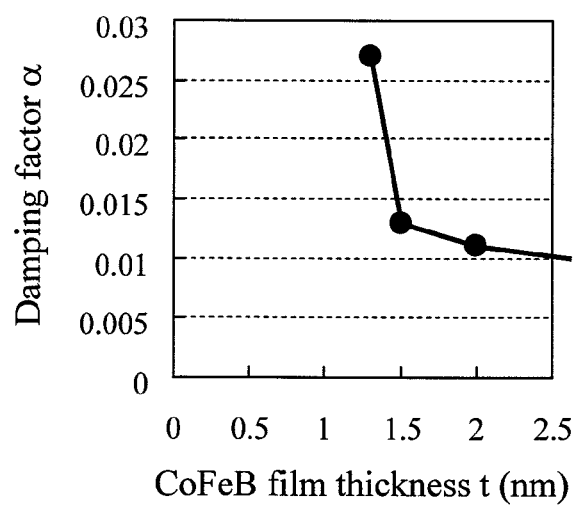
FIG. 6A shows a CoFeB film thickness dependency of the damping factor α of ferromagnet CoFeB.
Figure 6B:
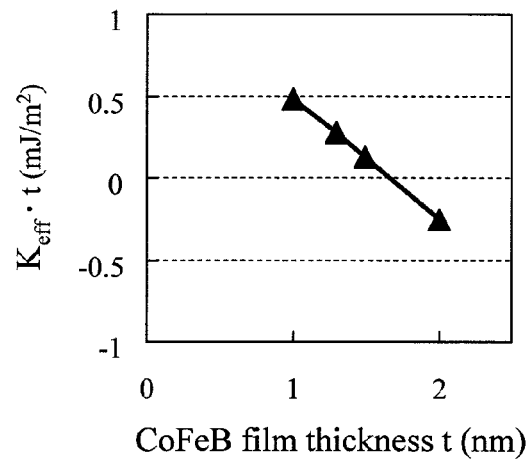
FIG. 6B shows a CoFeB film thickness dependency of $K_{eff} \cdot t$.

The values of $\alpha$ and $K_{eff}$ vary depending on the film thickness of $Co_{20}Fe_{60}B_{20}$. FIGS. 6A and 6B show the $Co_{20}Fe_{60}B_{20}$ film thickness dependency of $\alpha$ and $K_{eff} t$ (product of $K_{eff}$ and t). As shown in FIGS. 6A and 6B, $\alpha$ and $K_{eff} t$ increase as the $Co_{20}Fe_{60}B_{20}$ film thickness is decreased. From these characteristics and expression (1), it can be seen that the write current density $J_{c0}$ increases as the $Co_{20}Fe_{60}B_{20}$ film thickness is decreased. For the above reasons, in the configuration of the first embodiment, magnetization reversal is difficult to occur in the pinned layer (1.0 nm) compared with the recording layer (1.2 nm), so that the magnetization direction of the pinned layer can be stably retained when a current is caused to flow for rewriting information in the recording layer.

Figure 7:
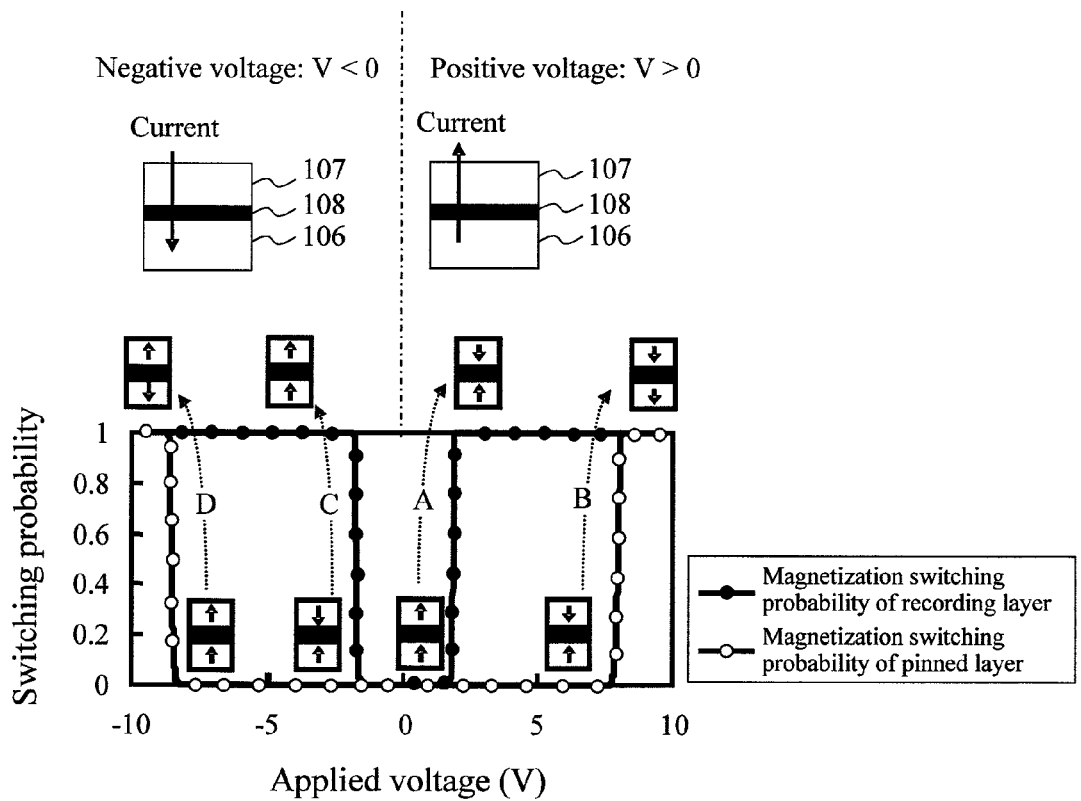
FIG. 7 shows the probability of magnetization reversal in a recording layer and a pinned layer of the magneto resistive effect element according to the present invention.

FIG. 7 shows the results of calculation of the probability of magnetization reversal of the recording layer and the pinned layer in the element according to the present embodiment. As shown, when the applied voltage is positive, a current flows through the magneto resistive effect element from bottom (pinned layer 106) to top (recording layer 107). When the voltage is applied in the positive direction and more than a certain current flows through the element, the magnetization of the recording layer 107 is reversed (change at A in the figure). At this time, the magnetization direction of the pinned layer 106 is still retained. As the positive voltage is further increased and the current flows, the magnetization of the pinned layer 106 is also eventually reversed (change at B in the figure); however, the voltage (current) required for magnetization reversal of the pinned layer 106 is significantly greater than the value required for the reversal of the recording layer 107. On the other hand, when a negative voltage is applied, a current flows from top (recording layer 107) to bottom (pinned layer 106) of the element. In this case, too, the voltage (current) required for the magnetization reversal of the pinned layer 106 (change at D in the figure) is significantly greater than the value for the magnetization reversal of the recording layer 107 (change at C in the figure), as in the case of the application of positive voltage. Thus, as described above, according to the present embodiment, the ease of magnetization reversal is controlled by providing a film thickness difference between the recording layer and the pinned layer, whereby an operation can be implemented in which the magnetization direction of the pinned layer can be stably retained at the time of rewriting information of the recording layer (magnetization reversal).

Preparation and evaluation of the element with the configuration of the first embodiment has shown a resistance change due to magnetization reversal in perpendicular direction and a MR ratio of 100% or higher. It has also been confirmed that the magnetization of the pinned layer can be stably retained at the time of rewriting of the recording layer, in agreement with the calculation results shown in FIG. 7.

According to the present embodiment, the first ferromagnetic layer 106 is used as the pinned layer while the second ferromagnetic layer 107 is used as the recording layer. However, the top-bottom positions of the layers may be switched such that the film thickness of the ferromagnetic layer disposed over the non-magnetic layer 108 is decreased compared with the ferromagnetic layer disposed under the non-magnetic layer 108. In this case, the ferromagnetic layer disposed over the non-magnetic layer 108 is the pinned layer.

While according to the present embodiment CoFeB is used as the material of the first ferromagnetic layer 106 and the second ferromagnetic layer 107, other materials may be used. For example, a material containing at least one type of 3d transition metal element, such as CoFe and Fe, is used. Further, a Heusler alloy represented by $Co_2MnSi$, $Co_2FeAl$, $Co_2CrAl$, and the like may be used. Heusler alloys are a half metal material and therefore have high spin polarizability, so that the MR ratio can be further increased. In addition, Heusler alloys have a small damping factor $\alpha$ compared with conventional ferromagnets. The materials that have been considered as perpendicular magnetization material generally have a large damping factor, such as on the order of 0.1 for a Co/Pt multilayer film. In comparison, CoFeB used in the present embodiment has a low damping factor of not more than 0.03 (depending on film thickness). A Heusler alloy, such as $Co_2FeMnSi$, has an even lower damping factor of less than 0.01. Thus, by applying a Heusler alloy with the small damping factor $\alpha$ in the recording layer, the write current density $J_{c0}$ can be further decreased.

While according to the present embodiment MgO is used as the material of the non-magnetic layer 108, other materials may be used. For example, an oxygen-containing compound such as $Al_2O_3$ and $SiO_2$, a semiconductor such as ZnO, or a metal such as Cu is used. When an amorphous insulator of $Al_2O_3$, $SiO_2$, and the like is used as the barrier layer, the MR ratio may be decreased compared with the case where MgO is used. However, because of the effect of making the magnetization of the first ferromagnetic layer 106 and the second ferromagnetic layer 107 perpendicular, the function as a magneto resistive effect element with perpendicular magnetization can be provided. When a metal such as Cu is used for the non-magnetic layer 108, an oxygen-containing compound may be used for the underlayer 503 and the capping layer 504 so as to cause the magnetization of the first ferromagnetic layer 106 and the second ferromagnetic layer 107 to be perpendicular.

<Second Embodiment>

The second embodiment proposes a magneto resistive effect element in which layers of different crystalline structures are applied in the pinned layer and the recording layer.

The magneto resistive effect element according to the second embodiment is similar to the first embodiment shown in FIG. 5 in basic structure and the film thickness of the various layers. For the non-magnetic layer 108, MgO (film thickness: 1 nm) is used, while Ta (film thickness: 5 nm) is used for the underlayer 503 and the capping layer 504. The second embodiment differs from the first embodiment in that crystallized $Co_{20}Fe_{60}B_{20}$ (film thickness: 1 nm) is used for the first ferromagnetic layer 106 as the pinned layer while $Co_{20}Fe_{60}B_{20}$ (film thickness: 1.2 nm) in amorphous state is used for the second ferromagnetic layer 107 as the recording layer. The magnetic anisotropy energy $K_{eff}$ is greater in crystalline state than in amorphous state. As described with reference to the first embodiment, the write current density $J_{c0}$ required for magnetization reversal of the magnetic layer depends on $K_{eff}$. Thus, in the above configuration, magnetization reversal is difficult to occur in the pinned layer compared with the recording layer. Accordingly, an operation can be implemented in which the magnetization direction of the pinned layer can be stably retained at the time of a writing operation for the recording layer.

A method for making a layered film for the element according to the second embodiment will be described with reference to FIG. 5. The underlayer 503, the first ferromagnetic layer 106, and the non-magnetic layer 108 are layered by sputtering at ultrahigh vacuum and room temperature, followed by annealing the laminated layers at 350° C. At this time, $Co_{20}Fe_{60}B_{20}$ of the first ferromagnetic layer 106 is in amorphous state at the time of film formation at room temperature but is crystallized by the subsequent annealing. Thereafter, the temperature is brought back to room temperature, and the second magnetic layer 107 and the capping layer 504 are layered. By this method, the layered film with a structure such that the second ferromagnetic layer 107 is in amorphous state and the first ferromagnetic layer 106 is crystallized can be realized. Although CoFeB is in amorphous state, the magnetization direction can be made perpendicular by controlling the film thickness.

Preferably, in order to obtain a higher MR ratio in the element made by the above method, annealing is performed at temperature of approximately 200° C. after the layered film is made. In this way, crystallization proceeds only at the interface with the non-magnetic layer 108 while the second ferromagnetic layer 107 is generally in amorphous state, whereby an increase in MR ratio can be achieved.

Preparation and evaluation of the element according to the second embodiment have shown a resistance change due to magnetization reversal in perpendicular direction and a MR ratio of not less than 100%. It has also been confirmed that the magnetization of the pinned layer can be stably retained at the time of rewriting of the recording layer.

In another method, CoFe as crystalline material may be used for the ferromagnetic layer for the pinned layer, while amorphous CoFeB may be used for the ferromagnetic layer for the recording layer.

While according to the present embodiment MgO is used as the material of the non-magnetic layer 108, other materials may be used. For example, an oxygen-containing compound such as $Al_2O_3$ and $SiO_2$, a semiconductor such as ZnO, or a metal such as Cu is used. When an amorphous insulator of $Al_2O_3$, $SiO_2$, and the like is used as the barrier layer, the MR ratio may be decreased compared with the case where MgO is used. However, because of the effect of causing the magnetization of the first ferromagnetic layer 106 and the second ferromagnetic layer 107 to be perpendicular, the function as a magneto resistive effect element with perpendicular magnetization can be provided. When a metal such as Cu is used in the non-magnetic layer 108, an oxygen-containing compound may be used in the underlayer 503 and the capping layer 504 so as to cause the magnetization of the first ferromagnetic layer 106 and the second ferromagnetic layer 107 to be perpendicular.

While in the foregoing embodiment a film thickness difference is provided between the first ferromagnetic layer 106 and the second ferromagnetic layer 107, the two layers may have the same film thickness and yet the operation as a magneto resistive effect element with perpendicular magnetization can be provided. In this case, too, because of the difference in crystalline structure between the first ferromagnetic layer 106 and the second ferromagnetic layer 107, there is a difference in perpendicular magnetic anisotropy between the layers. Thus, magnetization reversal is more difficult to occur in the first ferromagnetic layer 106 as the pinned layer than in the second ferromagnetic layer 107 as the recording layer. Accordingly, although the magnetization stability of the pinned layer may be decreased compared with the configuration according to the foregoing embodiment, the magnetization direction of the pinned layer can be fixed at the time of rewriting the recording layer.

<Third Embodiment>

The third embodiment proposes a magneto resistive effect element such that the magnetization of the pinned layer is stabilized by a non-magnetic layer adjoining the pinned layer.

The magneto resistive effect element according to the third embodiment is similar to the first embodiment shown in FIG. 5 in basic structure and the film thickness of the various layers. For the first ferromagnetic layer 106, $Co_{20}Fe_{60}B_{20}$ (film thickness: 1 nm) is used; for the second ferromagnetic layer 107, $Co_{20}Fe_{60}B_{20}$ (film thickness: 1.2 nm) is used; and for the non-magnetic layer 108, MgO (film thickness: 1 nm) is used. The third embodiment differs from the first embodiment in that Pt (film thickness: 5 nm) is used for the underlayer 503, and Ta (film thickness: 5 nm) is used for the capping layer 504. After the layered film is made, annealing is performed at 300° C.

When a material with strong spin-orbit interaction, such as Pt as used for the underlayer 503 according to the third embodiment, is connected to a magnetic layer, the damping factor α of the magnetic layer increases. As described with reference to expression (1) in the first embodiment, as α increases, the write current density $J_{c0}$ is increased. On the other hand, in the capping layer 504 connected on the recording layer side, it is preferable to use a non-magnetic material with weak spin-orbit interaction such that the damping factor α of the adjacent magnetic layer is decreased, such as Ta used in the present embodiment, Cu, or Mg. By such combinations, the $J_{c0}$ of the pinned layer with a large α is increased compared with the recording layer with small α. As a result, an erroneous operation in which the magnetization of the pinned layer is erroneously reversed by the current that flows at the time of rewriting information in the recording layer can be prevented, and a stable operation can be implemented.

Preparation and evaluation of the element with the configuration of the third embodiment has shown a resistance change due to magnetization reversal in perpendicular direction and a MR ratio of not less than 100%. It has also been confirmed that the magnetization of the pinned layer can be stably retained at the time of rewriting the recording layer.

While according to the present embodiment the first ferromagnetic layer 106 is used as the pinned layer and the second ferromagnetic layer 107 is used as the recording layer, the top-bottom positions of the layers may be switched such that the film thickness of the ferromagnetic layer disposed over the non-magnetic layer 108 is decreased compared with the film thickness of the ferromagnetic layer disposed under the first non-magnetic layer 108. Thus, the ferromagnetic layer disposed over the non-magnetic layer 108 provides the pinned layer. In this case, Pt may be used for the non-magnetic layer (capping layer 504) adjoining the ferromagnetic layer disposed over the non-magnetic layer 108, while Ta may be used for the non-magnetic layer (underlayer 503) adjoining the ferromagnetic layer disposed under the non-magnetic layer 108.

While according to the present embodiment CoFeB is used as the material of the first ferromagnetic layer 106 and the second ferromagnetic layer 107, other materials may be used. For example, a material containing at least one type of 3d transition metal element, such as CoFe or Fe, is used. Further, a Heusler alloy represented by $Co_2MnSi$, $Co_2FeAl$, $Co_2CrAl$, and the like may be used. Heusler alloys are a half metal material and therefore have a high spin polarizability such that the MR ratio can be further increased. Heusler alloys have a small damping factor α compared with conventional ferromagnets. The materials that have been considered as a perpendicular magnetization material generally have a large damping factor, such as on the order of 0.1 for a Co/Pt multilayer film. In comparison, CoFeB used in the present embodiment has a low damping factor of not more than 0.03 (depending on film thickness). A Heusler alloy, such as $Co_2FeMnSi$, has an even lower damping factor of less than 0.01. Thus, by utilizing a Heusler alloy with the small damping factor α in the recording layer, the write current density $J_{c0}$ can be further decreased.

While according to the present embodiment Pt is used for the non-magnetic layer 503 (underlayer) adjoining the first ferromagnetic layer 106, i.e., the pinned layer, other materials with strong spin-orbit interaction, such as Pd, may be used.

Further, while according to the present embodiment MgO is used as the material of the non-magnetic layer 108, other materials may be used. For example, an oxygen-containing compound such as $Al_2O_3$ and $SiO_2$, or a semiconductor such as ZnO, may be used. When an amorphous insulator of $Al_2O_3$, $SiO_2$, and the like is used as the barrier layer, the MR ratio may be decreased compared with the case where MgO is used. However, because of the effect of making the magnetization of the first ferromagnetic layer 106 and the second ferromagnetic layer 107 perpendicular, the function as a magneto resistive effect element with perpendicular magnetization can be provided.

Further, while according to the foregoing embodiment the film thickness difference is provided between the first ferromagnetic layer 106 and the second ferromagnetic layer 107, the layers may have the same film thickness and yet the operation as a magneto resistive effect element with perpendicular magnetization can be provided. In this case, too, because of the effect of the underlayer 503 and the capping layer 504, the damping factors a of the first ferromagnetic layer 106 and the second ferromagnetic layer 107 are varied such that magnetization reversal is difficult to occur in the first ferromagnetic layer 106 providing the pinned layer compared with the second ferromagnetic layer 107 providing the recording layer. Thus, although the stability of magnetization of the pinned layer may be decreased compared with the foregoing embodiment, the magnetization direction of the pinned layer can be fixed at the time of rewriting of the recording layer.

<Fourth Embodiment>

The fourth embodiment proposes a magneto resistive effect element such that the magnetization of the pinned layer is stabilized by a non-magnetic layer adjoining the pinned layer, as in the third embodiment.

The magneto resistive effect element according to the fourth embodiment is similar to the first embodiment shown in FIG. 5 in basic structure and the film thickness of the various layers. For the first ferromagnetic layer 106, $Co_{20}Fe_{60}B_{20}$ (film thickness: 1 nm) is used; for the second ferromagnetic layer 107, $Co_{20}Fe_{60}B_{20}$ (film thickness: 1.2 nm) is used; and for the non-magnetic layer 108, MgO (film thickness: 1 nm) is used. The fourth embodiment differs from the first embodiment in that MgO (film thickness: 1 nm) is used for the underlayer 503, and Ta (film thickness: 5 nm) is used for the capping layer 504. After the layered film according to the fourth embodiment is made, annealing is performed at 300° C.

As described with reference to the first embodiment, the magnetization of CoFeB of the first ferromagnetic layer 106 and the second ferromagnetic layer 107 is oriented in a perpendicular direction by a change in anisotropy at the interface between MgO of the non-magnetic layer 108 and the adjoining layers. This effect is particularly exhibited when an oxygen-containing compound, such as MgO, is adjacent. According to the fourth embodiment, the underlayer 503 of MgO is connected to the first ferromagnetic layer 106 as the pinned layer. In this way, the magnetization of the pinned layer is more stabilized in the perpendicular direction; namely, $K_{eff}$ of expression (1) is increased. As a result, as will be seen from expression (1), the current density $J_{c0}$ required for magnetization reversal is increased. Because of this effect, the magnetization of the pinned layer is stably retained even when a current is caused to flow through the element for rewriting information in the recording layer.

Preparation and evaluation of the element according to the fourth embodiment has shown a resistance change due to magnetization reversal in perpendicular direction and a MR ratio of not less than 100%. It has also been confirmed that the magnetization of the pinned layer can be stably retained at the time of rewriting the recording layer.

While according to the present embodiment the first ferromagnetic layer 106 is used as the pinned layer and the second ferromagnetic layer 107 is used as the recording layer, the top-bottom positions of the layers may be switched such that the film thickness of the ferromagnetic layer disposed over the non-magnetic layer 108 is decreased compared with the ferromagnetic layer disposed under the non-magnetic layer 108. In this case, the ferromagnetic layer disposed over the non-magnetic layer 108 is the pinned layer. Further, in this case, MgO is used for the non-magnetic layer (capping layer 504) adjoining the ferromagnetic layer disposed over the non-magnetic layer 108, while Ta is used for the non-magnetic layer (underlayer 503) adjoining the ferromagnetic layer disposed under the non-magnetic layer 108.

While in the present embodiment CoFeB is used as the material of the first ferromagnetic layer 106 and the second ferromagnetic layer 107, other materials may be used. For example, a material containing at least one type of 3d transition metal element, such as CoFe or Fe, is used. Further, a Heusler alloy represented by $Co_2MnSi$, $Co_2FeAl$, $Co_2CrAl$, and the like may be used. Heusler alloys are a half metal material and therefore have high spin polarizability such that the MR ratio can be further increased. Heusler alloys have a small damping factor α compared with conventional ferromagnets. The materials that have been considered as a perpendicular magnetization material generally have a high damping factor, such as on the order of 0.1 for a Co/Pt multilayer film. In comparison, CoFeB used in the present embodiment has a low damping factor of not more than 0.03 (depending on film thickness). However, a Heusler alloy, such as $Co_2FeMnSi$, has an even lower damping factor of less than 0.01. Thus, by applying a Heusler alloy with the small damping factor α in the recording layer, the write current density $J_{c0}$ can be further decreased.

While according to the present embodiment MgO is used for the non-magnetic layer (underlayer 503) adjacent the first ferromagnetic layer 106, i.e., the pinned layer, other compounds containing oxygen, such as $Al_2O_3$ or $SiO_2$, may be used.

While according to the present embodiment MgO is used as the material of the non-magnetic layer 108, other materials may be used. For example, an oxygen-containing compound such as $Al_2O_3$ or $SiO_2$, or a semiconductor such as ZnO, is used. When an amorphous insulator of $Al_2O_3$, $SiO_2$, and the like is used as the barrier layer, the MR ratio may be decreased compared with the case where MgO is used. However, because of the effect of making the magnetization of the first ferromagnetic layer 106 and the second ferromagnetic layer 107 perpendicular, the function as a magneto resistive effect element with perpendicular magnetization can be provided.

Further, while according to the present embodiment a film thickness difference is provided between the first ferromagnetic layer 106 and the second ferromagnetic layer 107, the layers may have the same film thickness and yet the operation as a magneto resistive effect element of perpendicular magnetization can be provided. In this case, too, because of the effect of the underlayer 503 and the capping layer 504, the damping factors α of the first ferromagnetic layer 106 and the second ferromagnetic layer 107 are varied such that magnetization reversal is difficult to occur in the first ferromagnetic layer 106 providing the pinned layer compared with the second ferromagnetic layer 107 providing the recording layer. Thus, while the stability of the magnetization of the pinned layer may be decreased compared with the configuration of the foregoing embodiment, the magnetization direction of the pinned layer can be fixed at the time of rewriting the recording layer.

<Fifth Embodiment>

The fifth embodiment proposes an element with a structure such that a material of the same material type but with different composition ratios is applied in the pinned layer and the recording layer.

The magneto resistive effect element according to the fifth embodiment is similar to the first embodiment shown in FIG. 5 in basic structure and the film thickness of the various layers. However, according to the fifth embodiment, a material with different compositions is used for the respective magnetic layers; specifically, $Co_{20}Fe_{60}B_{20}$ (film thickness: 1 nm) is used for the first ferromagnetic layer 106 while $Co_{40}Fe_{40}B_{20}$ (film thickness: 1.2 nm) is used for the second ferromagnetic layer 107. The perpendicular magnetic anisotropy energy density $K_{eff}$ is higher in $Co_{20}Fe_{60}B_{20}$ with a higher Fe composition ratio than in $Co_{40}Fe_{40}B_{20}$. Because the write current density $J_{c0}$ required for magnetization reversal of the magnetic layer depends on $K_{eff}$, magnetization reversal is difficult to occur in the pinned layer compared with the recording layer according to the above configuration. Thus, the magnetization direction of the pinned layer is stably retained at the time of a write operation for the recording layer, so that a highly reliable operation can be implemented.

Preparation and evaluation of the element according to the fifth embodiment has shown a resistance change by magnetization reversal in perpendicular direction and a MR ratio of not less than 100%. It has also been confirmed that the magnetization of the pinned layer can be stably retained at the time of rewriting the recording layer.

While according to the present embodiment CoFeB is used as the material of the first ferromagnetic layer 106 and the second ferromagnetic layer 107, other materials may be used. For example, a material containing at least one type of 3d transition metal element, such as CoFe or Fe, is used. Obviously, effects similar to those of the present embodiment can be obtained by applying crystallized $Co_{40}Fe_{40}B_{20}$ for the first ferromagnetic layer 106 providing the pinned layer and $Co_{20}Fe_{60}B_{20}$ in amorphous state for the second ferromagnetic layer 107 providing the recording layer, as in the second embodiment.

While according to the present embodiment Ta is used for the underlayer 503, in order to stabilize the magnetization of the pinned layer more, it may be effective to use a metal with large spin-orbit interaction, such as Pt or Pd, or an oxygen-containing compound, such as MgO, as in the third embodiment or the fourth embodiment.

While according to the present embodiment MgO is used as the material of the non-magnetic layer 108, other materials may be used. For example, an oxygen-containing compound such as $Al_2O_3$ or $SiO_2$, or a semiconductor such as ZnO is used. When an amorphous insulator of $Al_2O_3$, $SiO_2$, and the like is used as the barrier layer, the MR ratio may be decreased compared with the case where MgO is used; however, because of the effect of making the magnetization of the first ferromagnetic layer 106 and the second ferromagnetic layer 107 perpendicular, the function as a magneto resistive effect element with perpendicular magnetization can be provided.

<Sixth Embodiment>

The sixth embodiment proposes a magneto resistive effect element such that the magnetization of the pinned layer is more stabilized by connecting an antiferromagnet layer to the pinned layer.

Figure 8:
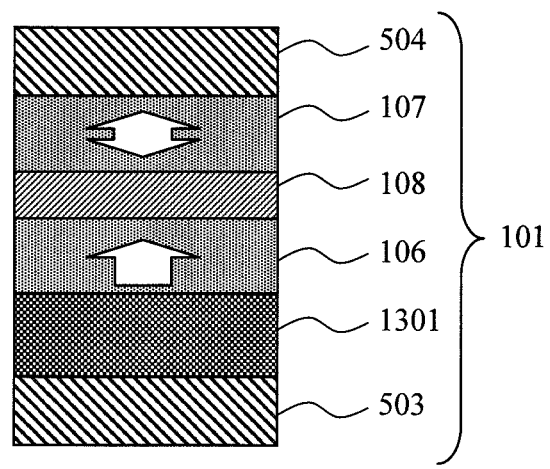
FIG. 8 is a schematic cross sectional view of an example of the magneto resistive effect element according to the present invention.

FIG. 8 schematically shows a cross section of a layered film of the element according to the sixth embodiment. The element according to the sixth embodiment is similar to the first embodiment shown in FIG. 5 in basic structure and the film thickness of the various layers. For the first ferromagnetic layer 106, $Co_{20}Fe_{60}B_{20}$ (film thickness: 1 nm) is used; for the second ferromagnetic layer 107, $Co_{20}Fe_{60}B_{20}$ (film thickness: 1.2 nm) is used; for the non-magnetic layer 108, MgO (film thickness: 1 nm) is used; and for the capping layer 504, Ta (film thickness: 5 nm) is used. The sixth embodiment differs from the first embodiment in that NiFe (film thickness: 3 nm) is used for the underlayer 503, and an antiferromagnetic layer 1301 of MnIr (film thickness: 8 nm) is layered on the underlayer 503. After the layered film is made, annealing is performed at 300° C.

By using the antiferromagnetic layer 1301 as an underlayer for the first ferromagnetic layer 106 providing the pinned layer, the magnetization of the pinned layer can be more stabilized. Thus, the erroneous operation in which the magnetization of the pinned layer is reversed by current that flows at the time of writing information in the recording layer can be suppressed.

Preparation and evaluation of the element according to the sixth embodiment has shown a resistance change by magnetization reversal in perpendicular direction and a MR ratio of not less than 100%. It has also been confirmed that the magnetization of the pinned layer can be stably retained at the time of rewriting the recording layer.

While according to the present embodiment CoFeB is used as the material of the first ferromagnetic layer 106 and the second ferromagnetic layer 107, other materials may be used. For example, a material containing at least one type of 3d transition metal element, such as CoFe or Fe, may be used. Further, amorphous CoFeB may be used for the second ferromagnetic layer 107 forming the recording layer, as in the second embodiment. A Heusler alloy represented by $Co_2MnSi$, $Co_2FeAl$, $Co_2CrAl$, or the like may also be used. Heusler alloys are a half metal material and therefore have high spin polarizability such that the MR ratio can be further increased. Heusler alloys have small damping factor $\alpha$ compared with conventional ferromagnets. The materials that have been considered as a perpendicular magnetization material generally have a large damping factor, such as on the order of 0.1 for a Co/Pt multilayer film. In comparison, CoFeB used in the present embodiment has a low damping factor of not more than 0.03 (depending on film thickness). A Heusler alloy, such as $Co_2FeMnSi$, has an even lower damping factor of less than 0.01. Thus, by applying a Heusler alloy with the small damping factor $\alpha$ in the recording layer, the write current density $J_{c0}$ can be further decreased.

While in the present embodiment MgO is used as the material of the non-magnetic layer 108, other materials may be used. For example, an oxygen-containing compound such as $Al_2O_3$ or $SiO_2$, or a semiconductor such as ZnO, is used. When an amorphous insulator of $Al_2O_3$ or $SiO_2$ is used as the barrier layer, the MR ratio may be decreased compared with the case where MgO is used; however, because of the effect of making the magnetization of the first ferromagnetic layer 106 and the second ferromagnetic layer 107 perpendicular, the function as a magneto resistive effect element with perpendicular magnetization can be provided.

<Seventh Embodiment>

The seventh embodiment proposes a magneto resistive effect element in which the magnetization of the pinned layer is more stabilized by applying a pinned layer with a structure such that ferromagnetic layers and non-magnetic layers are alternately layered.

Figure 9:
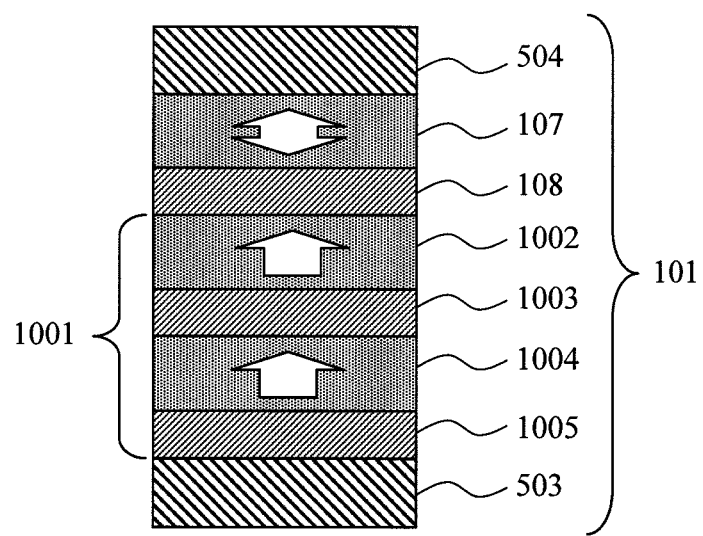
FIG. 9 is a schematic cross sectional view of an example of the magneto resistive effect element according to the present invention.

FIG. 9 schematically shows a cross section of a layered film of the element according to the seventh embodiment. In the seventh embodiment, a pinned layer 1001 has a layered structure of non-magnetic layer 1005/ferromagnetic layer 1004/non-magnetic layer 1003/ferromagnetic layer 1002. For the non-magnetic layer 1003 and the non-magnetic layer 1005, MgO (film thickness: 0.4 nm) is used. For the ferromagnetic layer 1002 and the ferromagnetic layer 1004, $Co_{20}Fe_{60}B_{20}$ (film thickness: 1 nm) is used. By adopting this layered structure, the number of interfaces between ferromagnetic layers and non-magnetic layers is increased, so that the interfacial effect for causing the magnetization direction of the pinned layer 1001 to be perpendicular is increased. Further, the total volume of the ferromagnetic layer portion of the pinned layer 1001 is increased, so that the magnetization direction is more stabilized in the perpendicular direction with respect to the film plane. As a result, the erroneous operation in which the magnetization of the pinned layer is reversed by the current that flows at the time of writing of information in the recording layer can be more suppressed. According to the seventh embodiment, MgO (film thickness: 1 nm) is used for the non-magnetic layer 108; Ta (film thickness: 5 nm) is used for the underlayer 503 and the capping layer 504; and $Co_{20}Fe_{60}B_{20}$ (film thickness: 1.2 nm) is used for the ferromagnetic layer 107 providing the recording layer.

Preparation and evaluation of the element according to the seventh embodiment has shown a resistance change by magnetization reversal in perpendicular direction and a MR ratio of not less than 100%. It has also been confirmed that the magnetization of the pinned layer can be stably retained at the time of rewriting the recording layer.

In order to stabilize the magnetization of the pinned layer, the number of the layers in the layered structure of the pinned layer may be increased. While according to the present embodiment MgO is used for the non-magnetic layer 1003 inserted between the ferromagnetic layer 1002 and the ferromagnetic layer 1004 of the pinned layer 1001, other materials may be used. For example, a material containing oxygen, such as $Al_2O_3$ or $SiO_2$, is used. Further, a metal such as Ru, Rh, V, Ir, Os, or Re may be used. In this case, due to the exchange coupling between the magnetizations of the ferromagnetic layer 1002 and the ferromagnetic layer 1004, the magnetization directions of the ferromagnetic layer 1002 and the ferromagnetic layer 1004 can be easily changed to parallel or anti-parallel by controlling the film thickness of the non-magnetic layer 1003.

Further, while according to the present embodiment CoFeB is used for the multiple ferromagnetic layers of the layered-structure pinned layer and the second ferromagnetic layer 107, other materials may be used. For example, a material containing at least one type of 3d transition metal element, such as CoFe or Fe, may be used. Further, a Heusler alloy represented by $Co_2MnSi$, $Co_2FeAl$, $Co_2CrAl$, or the like may be used. Heusler alloys are a half metal material and therefore have high spin polarizability such that the MR ratio can be further increased. Heusler alloys have small damping factor $\alpha$ compared with conventional ferromagnets. The materials that have been considered as a perpendicular magnetization material generally have a large damping factor, such as on the order of 0.1 for a Co/Pt multilayer film. In comparison, CoFeB used in the present embodiment has a low damping factor of not more than 0.03 (depending on film thickness). However, a Heusler alloy, such as $Co_2FeMnSi$, has an even lower damping factor of less than 0.01. Thus, by applying a Heusler alloy with the small damping factor $\alpha$ in the recording layer, the write current density $J_{c0}$ can be further decreased.

While according to the present embodiment MgO is used as the material of the non-magnetic layer 108, other materials may be used. For example, an oxygen-containing compound such as $Al_2O_3$ or $SiO_2$, or a semiconductor such as ZnO is used. When an amorphous insulator of $Al_2O_3$ or $SiO_2$ is used as the barrier layer, the MR ratio may be decreased compared with the case where MgO is used; however, because of the effect of causing the magnetization of the first ferromagnetic layer 106 and the second ferromagnetic layer 107 to be perpendicular, the function as a magneto resistive effect element with perpendicular magnetization can be provided.

<Eighth Embodiment>

According to another aspect of the present invention, a MRAM can be realized by adopting the magneto resistive effect element according to the first through the seventh embodiments as a recording element.

Figure 10:
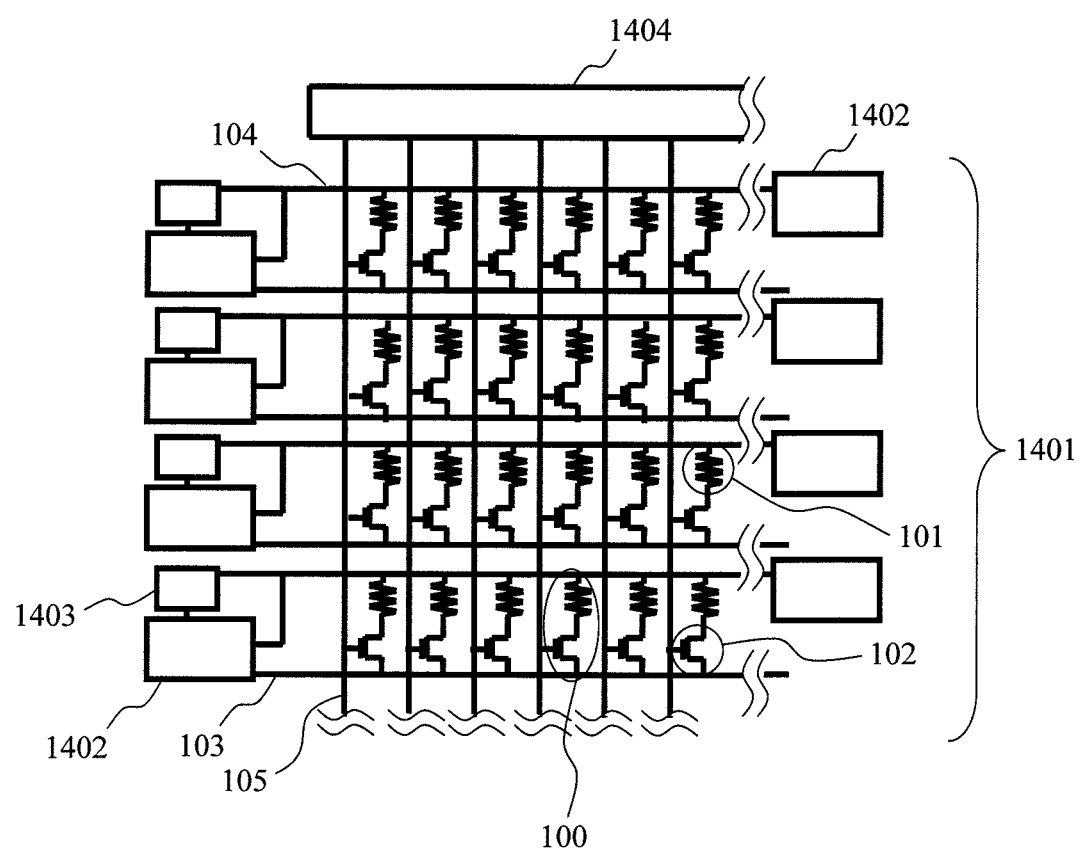
FIG. 10 is a conceptual diagram of an example of a magnetic memory according to the present invention.

As shown in FIG. 10, the MRAM according to the present invention is provided with a plurality of bit lines 104 disposed in parallel with each other; a plurality of source lines 103 disposed in parallel with the bit lines 104 and with each other; and a plurality of word lines 105 disposed perpendicular to the bit lines 104 and parallel with each other. At points of intersection of the bit lines 104 and the word lines 105, the memory cells 100 are disposed. The memory cells 100 are provided with the magneto resistive effect elements 101 according to the first through the seventh embodiments, and the select transistors 102. The multiple memory cells 100 constitute a memory array 1401. The bit lines 104 are electrically connected to drain electrodes of the select transistors 102 via the magneto resistive effect elements 101. The source lines 103 are electrically connected to source electrodes of the select transistors 102 via a wiring layer. The word lines 105 are electrically connected to gate electrodes of the select transistors 102. One end of the source lines 103 and the bit lines 104 is electrically connected to write drivers 1402 for applying voltage and to sense amplifiers 1403. One end of the word lines 105 is electrically connected to a word driver 1404.

In an operation for writing "0", a voltage is applied from the write driver 1402 to the bit line 104 while a voltage is applied from the word driver 1404 to the word line 105 so as to cause a current to flow through the source line 103 via the magneto resistive effect element 101 selected by the bit line 104. At this time, when the magneto resistive effect element 101 is configured such that, as shown in FIG. 5, the first ferromagnetic layer 106 is the pinned layer and the second ferromagnetic layer 107 is the recording layer, the magneto resistive effect element 101 has a low resistance and retains information "0". On the other hand, in an operation for writing "1", a voltage is applied from the write driver 1402 to the source line 103 and a voltage is applied from the word driver 1404 to the word line 105 so as to cause a current to flow through the bit line 104 via the magneto resistive effect element 101 selected by the source line 103. At this time, the magneto resistive effect element 101 has a high resistance and retains information "1". At the time of reading, the difference in a signal due to resistance change is read by the sense amplifiers 1403. By adopting the memory array of such configuration, the MRAM can operate as a non-volatile memory in which the magnetoresistance ratio is increased, the write current density is decreased, and the thermal stability factor is increased.

DESCRIPTION OF REFERENCE SIGNS

100 Memory cell of magnetic memory
101 Magneto resistive effect element
102 Select transistor
103 Source line
104 Bit line
105 Word line
106 First ferromagnetic layer
107 Second ferromagnetic layer
108 Non-magnetic layer
501 Magnetization
502 Magnetization
503 Underlayer
504 Capping layer
1001 Pinned layer
1002 Ferromagnetic layer
1003 Non-magnetic layer
1004 Ferromagnetic layer
1005 Non-magnetic layer
1301 Antiferromagnetic layer
1401 Memory array
1402 Write driver
1403 Sense amplifier
1404 Word driver

The invention claimed is:

1. A magneto resistive effect element comprising:
   a pinned layer with a fixed magnetization direction;
   a recording layer with a variable magnetization direction; and
   a first non-magnetic layer disposed between the pinned layer and the recording layer,
   wherein:
   one of the pinned layer and the recording layer is formed from a ferromagnet including at least one type of a 3d transition metal and enabling the magnetization direction to be changed from a parallel direction to a perpendicular direction with respect to a film plane by a film thickness control;
   the magnetization direction is oriented in the perpendicular direction with respect to the film plane by the film thickness control; and
   a ferromagnetic layer that forms the pinned layer has a film thickness smaller than the film thickness of the recording layer.

2. The magneto resistive effect element according to claim 1, wherein the 3d transition metal is at least one of Co and Fe.

3. The magneto resistive effect element according to claim 1, wherein the pinned layer and the recording layer are Fe, CoFe, or CoFeB.

4. The magneto resistive effect element according to claim 1, wherein:
   the pinned layer and the recording layer are CoFe or CoFeB; and
   the pinned layer has a higher Fe content ratio in a composition ratio of Co and Fe than the recording layer.

5. The magneto resistive effect element according to claim 1, wherein the recording layer includes a Heusler alloy with a damping factor a of not more than 0.01.

6. The magneto resistive effect element according to claim 1, comprising an antiferromagnetic layer formed on a surface of the pinned layer on a side opposite to the first non-magnetic layer.

7. The magneto resistive effect element according to claim 1, wherein:
   the pinned layer has a layered structure of three or more ferromagnetic and non-magnetic layers alternately layered in order from a surface adjoining the first non-magnetic layer; and
   a plurality of ferromagnetic layers of the layered structure have magnetization directions coupled in parallel or anti-parallel to each other.

8. The magneto resistive effect element according to claim 7, wherein a non-magnetic layer alternately layered with the ferromagnetic layers is an insulator containing oxygen.

9. The magneto resistive effect element according to claim 7, wherein a non-magnetic layer alternately layered with the ferromagnetic layers is magnesium oxide.

10. The magneto resistive effect element according to claim 7, wherein a non-magnetic layer alternately layered with the ferromagnetic layers includes at least one of Ru, Rh, V, Ir, Os, and Re.

11. The magneto resistive effect element according to claim 1, wherein the first non-magnetic layer is an insulator containing oxygen.

12. The magneto resistive effect element according to claim 1, wherein the first non-magnetic layer is magnesium oxide.

13. The magneto resistive effect element according to claim 1, wherein the magnetoresistance ratio is controlled to be not less than 70%.

14. A magnetic memory comprising:
a plurality of bit lines disposed in parallel with each other;
a plurality of source lines disposed in parallel with the bit lines and with each other;
a plurality of word lines disposed in a direction intersecting the bit lines and in parallel with each other; and
a magneto resistive effect element disposed at a point of intersection of the bit lines and the word lines,
wherein:
the bit lines are electrically connected to one end of the magneto resistive effect element;
another end of the magneto resistive effect element is electrically connected to a drain electrode of a select transistor;
the source lines are electrically connected to a source electrode of the select transistor; and
the word lines are electrically connected to a gate electrode of the select transistor,
the magnetic memory further comprising a mechanism configured to apply a current in a direction perpendicular to a film plane of the magneto resistive effect element,
wherein the magneto resistive effect element is the magneto resistive effect element according to claim 1.

15. A magneto resistive effect element comprising:
a pinned layer with a fixed magnetization direction;
a recording layer with a variable magnetization direction; and
a first non-magnetic layer disposed between the pinned layer and the recording layer,
wherein:
one of the pinned layer and the recording layer is formed from a ferromagnet including at least one type of a 3d transition metal and enabling the magnetization direction to be changed from a parallel direction to a perpendicular direction with respect to a film plane by a film thickness control;
the magnetization direction is oriented in the perpendicular direction with respect to the film plane by the film thickness control;
the pinned layer is crystallized; and
the recording layer is in an amorphous state; and
wherein the pinned layer and recording layer are controlled such that magnetization of the pinned layer is less easily reversed than that of the recording layer by a control of ease of magnetization reversal of the pinned layer and the recording layer based on a film thickness difference between a ferromagnetic layer that forms the pinned layer and ferromagnetic layer that forms the recording layer, and by a control of ease of magnetization reversal based on a difference between the crystalline state and the amorphous state.

16. A magneto resistive effect element comprising:
a pinned layer with a fixed magnetization direction;
a recording layer with a variable magnetization direction; and
a first non-magnetic layer disposed between the pinned layer and the recording layer,
wherein:
at least one of the pinned layer and the recording layer is formed from a ferromagnet including at least one type of a 3d transition metal and enabling the magnetization direction to be changed from a parallel direction to a perpendicular direction with respect to a film plane by a film thickness control; and
the magnetization direction is oriented in the perpendicular direction with respect to the film plane by the film thickness control;
the magneto resistive effect element further comprising:
a second non-magnetic layer disposed on a surface of the pinned layer on a side opposite to the first non-magnetic layer; and
a third non-magnetic layer disposed on a surface of the recording layer on a side opposite to the first non-magnetic layer,
wherein the second non-magnetic layer is of a material with a large spin-orbit interaction compared with the third non-magnetic layer.

17. The magneto resistive effect element according to claim 16, wherein the second non-magnetic layer is Pt or Pd.

18. The magneto resistive effect element according to claim 16, wherein:
the pinned layer and the recording layer are controlled such that magnetization of the pinned layer is less easily reversed than that of the recording layer by a control of ease of magnetization reversal of the pinned layer and the recording layer based on a film thickness difference between a ferromagnetic layer that forms the pinned layer and a ferromagnetic layer that forms the recording layer, and by a control of ease of magnetization reversal based on a difference between a magnitude of the spin-orbit interaction of the second non-magnetic layer and that of the third non-magnetic layer.

19. A magneto resistive effect element comprising:
a pinned layer with a fixed magnetization direction;
a recording layer with a variable magnetization direction; and
a first non-magnetic layer disposed between the pinned layer and the recording layer,
wherein:
one of the pinned layer and the recording layer is formed from a ferromagnet including at least one type of a 3d transition metal and enabling the magnetization direction to be changed from a parallel direction to a perpendicular direction with respect to a film plane by a film thickness control; and
the magnetization direction is oriented in the perpendicular direction with respect to the film plane by the film thickness control,
the magneto resistive effect element further comprising a second non-magnetic layer disposed on a surface of the pinned layer on a side opposite to the first non-magnetic layer,
wherein the second non-magnetic layer is of a material containing oxygen.

20. The magneto resistive effect element according to claim 19, wherein the second non-magnetic layer is magnesium oxide.

21. The magneto resistive effect element according to claim 19, wherein:
the pinned layer and the recording layer are controlled such that magnetization of the pinned layer is less easily reversed than that of the recording layer by a control of ease of magnetization reversal of the pinned layer and the recording layer based on a film thickness difference between a ferromagnetic layer that forms the pinned layer and a ferromagnetic layer that forms the recording layer, and by a control of ease of magnetization reversal based on the second non-magnetic layer.

22. A magneto resistive effect element comprising:
a pinned layer with a fixed magnetization direction;
a recording layer with a variable magnetization direction; and
a first non-magnetic layer disposed between the pinned layer and the recording layer,
wherein:
one of the pinned layer and the recording layer includes at least one type of a 3d transition metal,
the magnetization direction is oriented in the perpendicular direction with respect to a film plane by a film thickness control, and
a ferromagnetic layer that forms the pinned layer has a film thickness smaller than a film thickness of a ferromagnetic layer that forms the recording layer.

23. A magneto resistive effect element, comprising:
a first non-magnetic layer including an oxygen-containing compound;
a first ferromagnetic layer disposed adjacent to the first non-magnetic layer, the first ferromagnetic layer including a Fe and B compound and having a magnetization direction that is oriented in the perpendicular direction with respect to the film plane due to a magnetic anisotropy at an interface between the first ferromagnetic layer including the Fe and B compound and the first-non-magnetic layer including the oxygen-containing compound; and
a second ferromagnetic layer disposed on a surface of the first non-magnetic layer on a side opposite to the first ferromagnetic layer, the second ferromagnetic layer having a magnetization direction that is oriented in the perpendicular direction with respect to the film plane, wherein
the first non-magnetic layer is a barrier layer, the first ferromagnetic layer is a recording layer, and the second ferromagnetic layer is a pinned layer.

24. The magneto resistive effect element according to claim 23, wherein:
the second ferromagnetic layer contains Fe and B, and has a magnetization direction that is oriented in the perpendicular direction with respect to the film plane due to a magnetic anisotropy at an interface with the first non-magnetic layer, and
a second non-magnetic layer is disposed on a surface of the first ferromagnetic layer on a side opposite to the first non-magnetic layer, the second non-magnetic layer containing a material with a smaller spin-orbit interaction than that of Pt.

25. The magneto resistive effect element according to claim 23, wherein the pinned layer and the recording layer is CoFeB.

26. The magneto resistive effect element according to claim 23, wherein:
the pinned layer and the recording layer are CoFeB; and
the pinned layer has a higher Fe content ratio in a composition ratio of Co and Fe than the recording layer.

27. The magneto resistive effect element according to claim 23, comprising an antiferromagnetic layer formed on a surface of the pinned layer on a side opposite to the first non-magnetic layer.

28. The magneto resistive effect element according to claim 23, wherein:
the pinned layer has a layered structure of three or more ferromagnetic and non-magnetic layers alternately layered in order from a surface adjoining the first non-magnetic layer; and
a plurality of ferromagnetic layers of the layered structure have magnetization directions coupled in parallel or anti-parallel to each other.

29. The magneto resistive effect element according to claim 28, wherein a non-magnetic layer alternately layered with the ferromagnetic layers is an insulator containing oxygen.

30. The magneto resistive effect element according to claim 28, wherein a non-magnetic layer alternately layered with the ferromagnetic layers is magnesium oxide.

31. The magneto resistive effect element according to claim 28, wherein a non-magnetic layer alternately layered with the ferromagnetic layers includes at least one of Ru, Rh, V, Ir, Os, and Re.

32. The magneto resistive effect element according to claim 23, wherein the first non-magnetic layer is magnesium oxide.

33. The magneto resistive effect element according to claim 23, wherein the magnetoresistance ratio is controlled to be not less than 70%.

34. A magnetic memory comprising:
a plurality of bit lines disposed in parallel with each other;
a plurality of source lines disposed in parallel with the bit lines and with each other;
a plurality of word lines disposed in a direction intersecting the bit lines and in parallel with each other; and
a magneto resistive effect element disposed at a point of intersection of the bit lines and the word lines,
wherein:
the bit lines are electrically connected to one end of the magneto resistive effect element;
another end of the magneto resistive effect element is electrically connected to a drain electrode of a select transistor;
the source lines are electrically connected to a source electrode of the select transistor; and
the word lines are electrically connected to a gate electrode of the select transistor,
the magnetic memory further comprising a mechanism configured to apply a current in a direction perpendicular to a film plane of the magneto resistive effect element,
wherein the magneto resistive effect element is the magneto resistive effect element according to claim 23.

* * * * *